(12) United States Patent
Suzuki et al.

(10) Patent No.: US 7,372,132 B2
(45) Date of Patent: May 13, 2008

(54) RESIN ENCAPSULATED SEMICONDUCTOR DEVICE AND THE PRODUCTION METHOD

(75) Inventors: Kazuhiro Suzuki, Mito (JP); Toshiaki Morita, Hitachi (JP); Hisayuki Imamura, Fukaya (JP); Junichi Watanabe, Kumagaya (JP); Mitsuaki Chiba, Hitachinaka (JP)

(73) Assignees: Hitachi, Ltd., Tokyo (JP); Hitachi Metals, Ltd., Tokyo (JP)

( * ) Notice: Subject to any disclaimer, the term of this patent is extended or adjusted under 35 U.S.C. 154(b) by 340 days.

(21) Appl. No.: 11/062,867

(22) Filed: Feb. 23, 2005

(65) Prior Publication Data
US 2005/0221538 A1    Oct. 6, 2005

(30) Foreign Application Priority Data
Mar. 15, 2004    (JP)    ............................. 2004-073305

(51) Int. Cl.
*H01L 23/34* (2006.01)
(52) U.S. Cl. ....................................... 257/676; 257/712
(58) Field of Classification Search ................ 257/676, 257/686, 712, 666, 678
See application file for complete search history.

(56) References Cited

U.S. PATENT DOCUMENTS 5,391,604 A    2/1995    Dietz et al.

(Continued)

FOREIGN PATENT DOCUMENTS

DE    197 24 909 A1    12/1998

(Continued)

*Primary Examiner*—Roy Potter
(74) *Attorney, Agent, or Firm*—Dickstein Shapiro LLP

(57) ABSTRACT

A semiconductor device having both high strength and high thermal radiation that is capable of being applied to mounting on automobiles experiencing many thermal cycles, and a manufacturing method thereof are provided. A circuit board 1a for a resin encapsulated semiconductor module device has a configuration where a silicon nitride plate 2 with a thickness of 0.635 mm has copper plates of 1.0 mm and 0.8 mm bonded to both sides thereof via active metal. A copper plate 3a is bonded to the surface side of the silicon nitride plate 2, and a prescribed circuit pattern is formed on the copper plate 3a. Tin-silver-copper cream solder layers 4a and 4b with a thickness of 200 μm are formed at a prescribed location on the circuit pattern 3a on which a semiconductor element 6 is mounted and at a prescribed location of a base plate 1 on which the circuit board 1a is disposed. Nickel particles 5 having a maximum particle size of 100 μm and an average particle size of 70 μm are dispersed in the solder 4a on the base plate 1 of good thermal conductivity. A semiconductor element (chip) 6, the circuit board 1a, and the base plate 1 are disposed on predetermined locations. Thereafter, they are set in a reflow oven (not shown in the drawings) for reflow soldering. After the inside of the reflow oven is replaced by a nitrogen atmosphere, the reflow oven is heated to 280° C. At the time when solder is melted, the inside of the oven is decompressed to 1 Pa, nitrogen is introduced, and the reflow oven is cooled to about room temperature, thereby completing the solder bonding step. After flux is washed, an outer case 7 with an insert-molded outlet terminal 8 is adhered to the base plate 1 and a predetermined connection is conducted via an aluminum bonding wire 9. Then, silicone gel 10 is injected into a package delimited via the base plate 1 and the outer case 7, and the silicone gel 10 is heat-hardened, thereby completing a resin encapsulated semiconductor device A.

13 Claims, 5 Drawing Sheets

U.S. PATENT DOCUMENTS

| | | | |
|---|---|---|---|
| 5,446,318 A * | 8/1995 | Koike et al. ................. 257/707 |
| 5,917,245 A | 6/1999 | Tomizawa | |
| 6,232,657 B1 * | 5/2001 | Komorita et al. ........... 257/700 |
| 6,690,087 B2 * | 2/2004 | Kobayashi et al. ......... 257/686 |
| 2001/0050422 A1 | 12/2001 | Kishimoto et al. | |
| 2006/0103005 A1 | 5/2006 | Schulz-Harder et al. | |

FOREIGN PATENT DOCUMENTS

| | | |
|---|---|---|
| DE | 102 27 658 A1 | 1/2004 |
| JP | 5-93038 | 12/1993 |
| JP | 9-162325 | 6/1997 |
| JP | 10-190176 | 7/1998 |
| JP | 11-40716 | 2/1999 |
| JP | 2002-84046 | 3/2002 |
| JP | 2003-243610 | 8/2003 |

* cited by examiner

SOLDER LAYER THICKNESS < 50μm

SOLDER LAYER THICKNESS ≥ 50μm

RESIN ENCAPSULATED SEMICONDUCTOR DEVICE AND THE PRODUCTION METHOD

This application is based on the Japanese Patent Application JP2004-073305, filed on Mar. 15, 2004, all the contents of witch is incorporated in this application by reference.

BACKGROUND OF THE INVENTION

1. Field of the Invention

The present invention relates to a power semiconductor module device, especially to a resin encapsulated power semiconductor module device that realizes effective thermal radiation, and a production method thereof.

2. Background Art

Conventionally, power semiconductor module devices have been used for electronic devices such as inverters, converters, servos, and the like. FIG. 5 shows a cross-sectional view of a conventional power semiconductor module device. As shown in FIG. 5, the power semiconductor module device comprises a circuit board with metal plates 103*a* and 103*b* bonded to both sides of a ceramic material 102, the circuit board being fixed on a metal base plate 101 using solder 104*a*. And a semiconductor element 106 is fixed on a surface side metal plate 103*a* of the aforementioned circuit board using solder 104*b*.

An outer case 107 having an insert-molded outlet terminal 108 is attached to the metal base plate 101 such that it is erected on the metal plate 101. Electric connection between the semiconductor element 106 and the outlet terminal 108 is performed via an aluminum bonding wire 109. A resin material 110, such as silicon gel, is used to fill in an internal space delimited by the outer case 107.

In the aforementioned electronic devices such as inverters, converters, servos, and the like, regarding semiconductor elements capable of use for various types of power systems that are usually mounted, such as diodes, transistors, IGBT (Insulated Gate Bipolar Transistor), MOSFET, or the like, ceramic materials are selected through which insulation and thermal conductivity functions of the circuit board are performed depending on each heat release value. In medium to high capacity devices that have high heat release values, aluminum nitride ceramics are mainly used. In small to medium capacity devices, alumina ceramics are used.

In particular, as the demand for the reduction of environmental burdens has been increasing, the application of power semiconductor mounted devices to automobiles, such as hybrid cars, has rapidly made progress. Conventionally, power devices applied to automobile driving systems have high heat release values, so that circuit boards employing aluminum nitride in an insulated layer have been used.

With the progress of material development technologies, silicon nitride having superior strength characteristics has attracted attention, and applied research has been in progress regarding silicon nitride having both high strength and high thermal conductivity to be used for silicon nitride circuit boards as a material substitutable for aluminum nitride circuit boards (see Patent Documents 1 to 3, for example).

Patent Document 1: JP Patent Publication (Kokai) No. 9-162325 A (1997)

Patent Document 2: JP Patent Publication (Kokai) No. 10-190176 A (1998)

Patent Document 3: JP Patent Publication (Kokai) No. 2002-84046 A

SUMMARY OF THE INVENTION

In terms of thermal characteristics, aluminum nitride is superior to silicon nitride. As one characteristic example, aluminum nitride has thermal conductivity of 150 W/(m·K), and silicon nitride has thermal conductivity of about 70 W/(m·K). For mounting on automobiles, reliability of mechanical strength is required, including vibration resistance or shock resistance, in addition to high thermal radiation. As mentioned above, aluminum nitride is a material superior in thermal conductivity. However, aluminum nitride is somewhat inferior in terms of strength characteristics. When thermal strain is repeatedly provided as in a heat cycle, or vibration or shock is repeatedly provided, the generation of material fracture, such as cracking, is problematic. If a circuit board is configured using a material subject to material fracture as an insulated layer, the aforementioned material fracture may lead to the failure of an entire system resulting from the insulated fracture of the circuit board, the impediment of a thermal path in a mounted member having high thermal radiation, or the like. In view of these problems, high strength characteristics in addition to high thermal radiation are desired for a circuit board to be mounted on automobiles in which strict reliability is required. As one characteristic example related thereto, aluminum nitride has a bending strength of about 350 MPa. Silicon nitride is superior in that it shows a bending strength of not less than 700 MPa. However, in practical applications, it is difficult to realize high strength and high thermal conductivity.

It is an object of the present invention to provide a resin encapsulated semiconductor module device having both high strength and high thermal conductivity such that it can be applied to fields where various types of strict reliabilities, such as for mounting on automobiles, are required, and to provide a manufacturing method thereof.

According to one aspect of the present invention, a resin encapsulated semiconductor device is provided. The resin encapsulated semiconductor device comprises a thermal conductive base plate, an insulated circuit board bonded to the base plate via a bonding material, an electronic component mounted on the insulated circuit board, and an outer case for forming a holding portion regarding the electronic component in the inside using the base plate and the outer case, the outer case being attached to the base plate. The insulated circuit board comprises an insulated plate and metal plates bonded to both sides of the insulated plate. The sum of the thicknesses of the metal plates is in a range of 0.9 mm to 2.2 mm. Also, the minimum thickness of the bonding material is maintained to be not less than 50 μm. In the case where the metal plates are relatively thick, voids generated in the bonding material can be removed by maintaining the thickness of the bonding material not less than 50 μm.

Further, a resin encapsulated semiconductor device is provided. The resin encapsulated semiconductor device comprises a thermal conductive base plate, an insulated circuit board bonded to the base plate via a bonding material, an electronic component mounted on the insulated circuit board, and an outer case for forming a holding portion regarding the electronic component in the inside using the base plate and the outer case, the outer case being attached to the base plate. The insulated circuit board comprises an insulated plate and metal plates bonded to both sides of the insulated plate. The sum of the thicknesses of the metal plates is in a range of 0.9 mm to 2.2 mm. Also, a wall portion is disposed in the aforementioned bonding material by which a conducting path for a gas generated in the bonding material is formed. In the case where the metal plates are relatively thick, voids generated in the bonding material can be removed by forming the conducting path in the bonding material.

Further, a resin encapsulated semiconductor device is provided. The resin encapsulated semiconductor device comprises a thermal conductive base plate, an insulated circuit board bonded to the base plate via a bonding material, an electronic component mounted on the insulated circuit board, and an outer case for forming a holding portion regarding the electronic component in the inside using the base plate and the outer case, the outer case being attached to the base plate. The resin encapsulated semiconductor device comprises the following conditions (a) and (b). (a): The insulated circuit board has a configuration where metal plates are bonded to both sides of a ceramic plate, and the sum of the thicknesses of the metal plates bonded to both sides, respectively, is in a range of 0.9 mm to 2.2 mm. (b): Substantially spherical elements for forming a wall portion are added to the bonding material. In the case where the metal plates are relatively thick, voids generated in the bonding material can be removed by adding the elements for forming the wall portion in the bonding material.

The aforementioned elements comprise metal particles having a melting point that is higher than that of the bonding material or protrusions formed on at least one of the base plate or the metal plate. The elements including the metal particles or the metal protrusions comprise a first element group and a second element group whose diameters or heights are different. The first element group is disposed to specify a space between the base plate and the metal plate bonded to the back of the insulated plate. The second element group is disposed to delimit a path.

The maximum diameter of the metal particles or the maximum height of the metal protrusions is in a range of 50 μm to 200 μm. The amount of the elements added is in a range of 0.005 vol % to 5 vol % relative to the volume of conductive component in the bonding material. This prevents aggregation and a path can be readily formed.

According to another aspect of the present invention, a method for manufacturing a semiconductor device is provided. The method comprises a step of preparing an insulated circuit board on which an electronic component is mounted via a second bonding material, where metal plates whose sum of the thicknesses is in a range of 0.9 mm to 2.2 mm are bonded to both sides of the insulated plate, respectively. The method also comprises a step of bonding the insulated circuit board on a conductive base plate via a first bonding material, where while maintaining the minimum thickness of the first bonding material not less than 50 μm, the first bonding material is reflowed under reduced pressure.

The conditions of the reduced pressure comprise a condition such that a void generated in the first bonding material in the reflow step is removed from the end of the board, thereby readily moving a gas in the first bonding material.

According to the present invention, by using a circuit board in which thick metal plates are bonded to both sides of silicon nitride that is superior in strength characteristics and by soldering the circuit board to a solder layer mounted on a base plate with substantially spherical elements disposed on the solder layer under reduced pressure, almost no void-like defects are generated in the solder layer, thereby realizing a semiconductor device superior in thermal radiation characteristics and strength reliability as compared with a semiconductor device in which a conventional circuit board is used.

Also, by employing the circuit board in which thick metal plates are bonded to both sides of silicon nitride, it becomes possible to approximate the thermal expansion coefficient of the circuit board to the thermal expansion coefficient of a metal base plate, thereby reducing stress fatigue generated in a solder portion that bonds the circuit board and the metal base plate and realizing a longer operating life for the semiconductor device.

DESCRIPTION OF THE PREFERRED EMBODIMENTS

When silicon nitride inferior to aluminum nitride in thermal conductivity is used as the insulated layer of the circuit board, if the thickness of the insulated layer is reduced in a range by which insulated characteristics can be secured, it becomes possible to approximate the thermal radiation characteristics to those of an aluminum nitride circuit board. Further, if the thickness of metal plates bonded to both sides of the insulated layer is increased to improve thermal spread, it becomes possible to realize a circuit board superior in thermal conductivity than in the case where aluminum nitride is used. By bonding thick metal plates to a thin insulated layer, defects, such as cracking, are likely to be generated in the insulated layer due to stress generated upon soldering. However, the aforementioned configuration can be realized by using silicon nitride superior in strength characteristics.

However, when the circuit board is mounted on a base plate of good thermal conductivity using soldering, it is learned from an examination by the inventors that the circuit board with bonded thick metal plates has a thin solder layer because of added weight, so that voids are prone to be trapped in the solder layer. Thus, the voids in the solder layer impede thermal radiation characteristics, so that a technology for controlling the void generation is important.

Figure 1A:
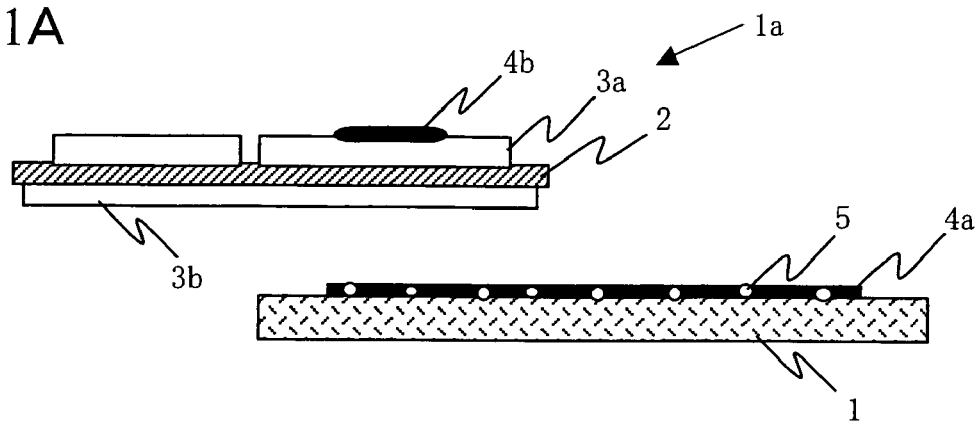
FIG. 1A to 1D show view of an assembling step for a resin encapsulated semiconductor device according to the embodiments of the present invention.

On the basis of the aforementioned consideration, a resin encapsulated semiconductor module device according to the embodiments of the present invention is described with reference to the drawings. A resin encapsulated semiconductor module device according to a first embodiment of the present invention is described. FIG. 1A to 1D show flow chart of assembling step for the resin encapsulated semiconductor module device according to the present embodiment. As shown in FIG. 1A, a circuit board 1a for the resin encapsulated semiconductor module device according to the present embodiment has a configuration where a silicon nitride plate 2 with a thickness of 0.635 mm has copper plates of 1.0 mm and 0.8 mm bonded to both sides thereof via active metal. A copper plate 3a is bonded to the surface side of the silicon nitride plate 2, and a prescribed circuit pattern is formed on the copper plate 3a by a known method, such as an etching method. In the following, the copper plate on the front side of the silicon nitride plate 2 is referred to as a circuit pattern, and the copper plate on the back side thereof is referred to as a back pattern. Although, copper materials used in each embodiment of the present invention, such as in the circuit pattern, the back pattern, and the base plate, are usually nickel plated for finishing, drawings of the nickel plating are omitted.

First, tin-silver-copper cream solder layers 4a with a thickness of 200 μm are formed at a prescribed location on the circuit pattern 3a on which a semiconductor element is mounted and at a prescribed location of a base plate 1 on which the circuit board 1a is disposed, using a printing technology, for example. Nickel particles 5 having a maximum particle size of 100 μm and an average particle size of 70 μm are dispersed in the solder layer 4a on the base plate 1 of good thermal conductivity. In this case, the volume ratio of the nickel particles relative to the metal element of the cream solder except the flux element is 0.2 vol % (FIG. 1A).

Figure 1B:
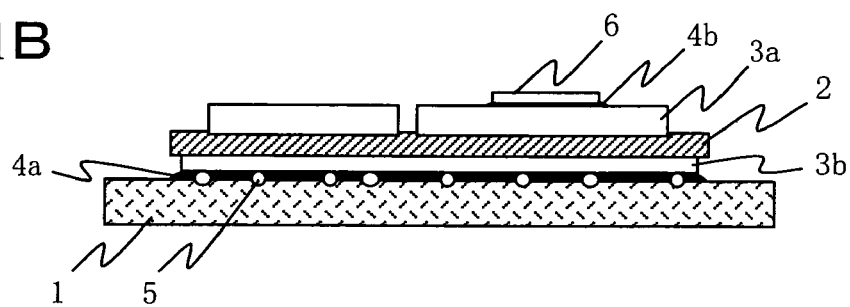
Figure 1C:
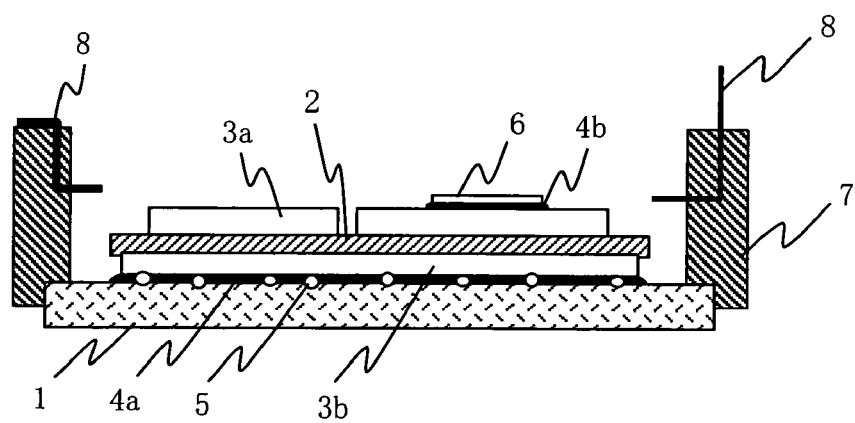

Then, a semiconductor element (chip) 6 (a diode element having a chip size of 6.5 mm×8 mm and a rated current of 100 A is used as an example), the circuit board 1a, and the base plate 1 are disposed on predetermined locations. Thereafter, they are set in a reflow oven (not shown in the drawings) for reflow soldering. After the inside of the reflow oven is replaced by a nitrogen atmosphere, the reflow oven is heated to 280° C. At the time when solder is melted, the inside of the oven is decompressed to 1 Pa, nitrogen is introduced, and the reflow oven is cooled to about room temperature, thereby completing the solder bonding step (FIG. 1B).

After flux is washed, an outer case 7 with an insert-molded outlet terminal 8 is adhered to the base plate 1 (FIG. 1C)) and a predetermined connection is conducted via an aluminum bonding wire 9. Then, silicone gel 10 is injected into a package delimited by the base plate 1 and the outer case 7, and the silicone gel 10 is heat-hardened, thereby completing a resin encapsulated semiconductor device A (see FIG. 1D).

When the solder bonding layer 4a under the circuit board 1a of the resin encapsulated semiconductor device A is observed using an ultrasonic reflectscope which is not shown in the drawings, almost no defects, such as voids, can be found in the solder bonding layer 4a (the area ratio of defect portions relative to the solder bonding area is not more than 0.5%). When a current is applied to the mounted element to generate heat, the thermal resistance of the semiconductor device is 0.2° C./W.

In this case, 500 times of thermal cycle processes at −60° C. to 150° C. are provided to the assembled resin encapsulated semiconductor device. After the thermal cycle processes, the state of the device is observed and the characteristics of the element are measured. As a result, abnormalities, such as destruction of the members of the element, for example, or exfoliation of bonded portions, are not observed, and thermal resistance shows almost no change.

The resin encapsulated semiconductor device according to the embodiments of the present invention is described in further detail with reference to FIGS. 2 and 3. FIGS. 2A and 2B schematically show states where voids (defects) in the solder layer are removed during decompression in the manufacturing step of the resin encapsulated semiconductor device according to the present embodiment. FIG. 2A shows a case where the thickness of the solder layer is less than 50 μm and FIG. 2B shows a case where the thickness of the solder layer is not less than 50 μm. FIG. 3A to 3C show cross-sectional views of configurations that are effective in removing the voids (defects) in the solder layer in the resin encapsulated semiconductor device according to the present embodiment. Description is made accordingly with reference to FIG. 1.

Figure 1D:
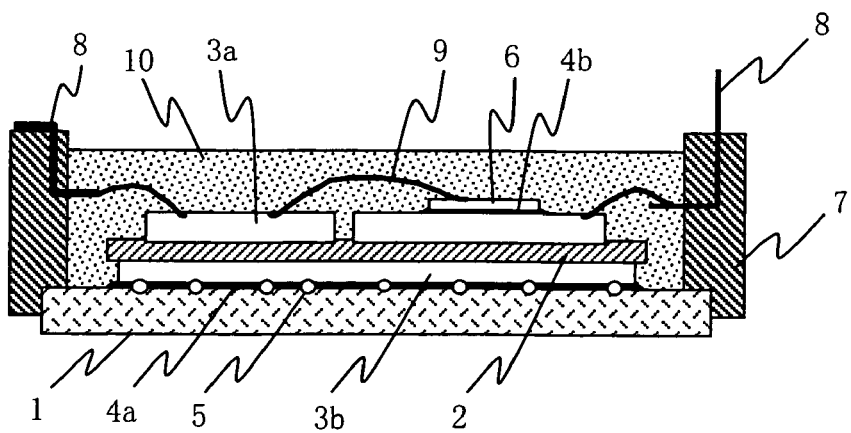
Figure 2A:
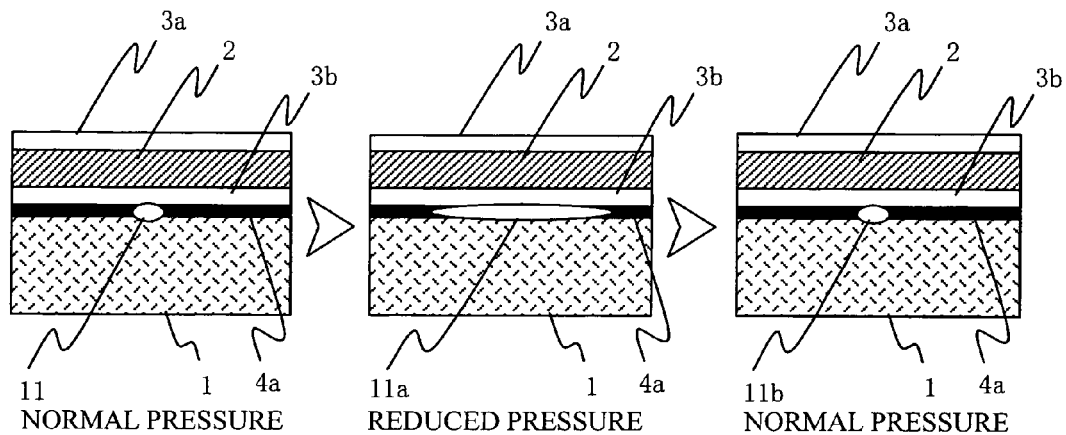
FIGS. 2A, 2B show image view of defect removal in a solder layer during decompression according to the present embodiment.
Figure 2B:
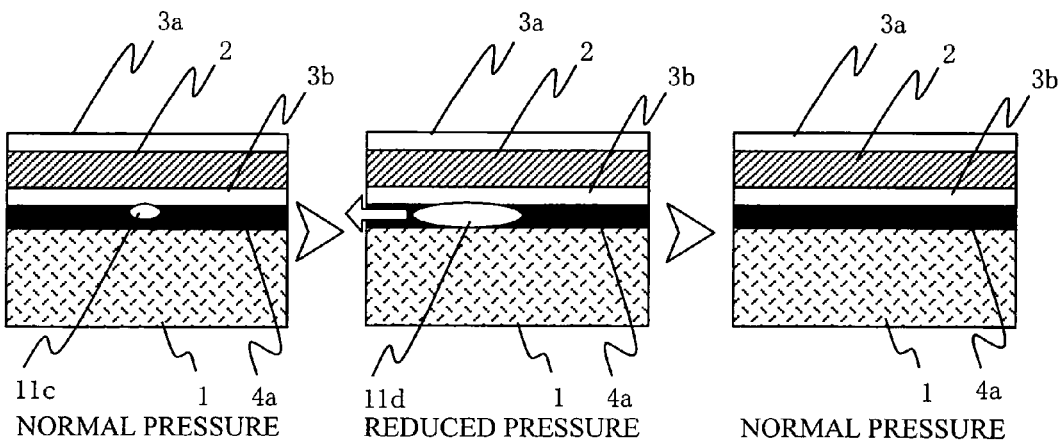

The resin encapsulated semiconductor module device according to the present embodiment comprises, as shown in FIG. 1D, the base plate 1 of good thermal conductivity, the insulated circuit board 2 bonded to the base plate 1 via a first bonding material, various types of electronic or electrical components including the semiconductor element 6 bonded and mounted on the insulated circuit board 2 via a second bonding material, and the outer case 7 adhered to the base plate 1. A package case for holding the semiconductor element 6 is configured via the base plate 1 and the outer case 7. In the resin encapsulated semiconductor device in which the aforementioned semiconductor element 6 is encapsulated via the resin 10, the insulated circuit board 2 has a configuration where a plurality of metal plates 3a and 3b are bonded to both sides of a ceramic plate and the sum of the thicknesses of the metal plates 3a and 3b bonded to the both sides is in a range of 0.9 mm to 2.2 mm. Also, the insulated circuit board 2 has elements for securing a thickness of not less than 50 μm as the thickness of the first bonding material 4a having fluidity so that a gas generated in the first bonding material 4a can be readily moved in a manufacturing step.

Further, the following conditions (a) and (b) are provided to the resin encapsulated semiconductor device comprising the base plate 1 of good thermal conductivity, the insulated circuit board 1a bonded to the base plate 1 via the first bonding material 4a, various types of electronic or electrical components including the semiconductor element 6 bonded and mounted on the insulated circuit board 1a via the second bonding material 4b, and the outer case 7 adhered to the base plate 1 in which the package case for holding the semiconductor element 6 is configured via the base plate 1 and the outer case 7 and the semiconductor element 6 is encapsulated via resin 10.

Condition (a): The insulated circuit board 1a has a configuration where a plurality of metal plates 3a and 3b are bonded to both sides of the ceramic plate 2, and the sum of the thicknesses of the metal plates 3a and 3b bonded to both sides, respectively, is in a range of 0.9 mm to 2.2 mm.

Condition (b): Substantially spherical elements are added to the first bonding material 4a. The elements are added to the aforementioned first bonding material 4a and are metallic additives, such as nickel, in a substantially spherical shape having a maximum particle size of 50 μm to 200 μm, for example.

By contrast, in order to reduce the warpage of the circuit board, the balance of thickness regarding the metal plates on both sides is also important. It is effective to have the thickness of the metal plate on the back side with a large area thinner than that of the metal plate on the front side.

In terms of the improvement of thermal radiation characteristics, the metal plates on both sides become effective as the thickness is increased. However, in view of the bonding reliability with the semiconductor element mounted on the metal plate on the front side, the thickness of the metal plates is limited. Since the metallic characteristics gradually become perceptible as the front side plate thickness is increased, a mismatch with the semiconductor element disposed thereon regarding thermal expansion coefficient is increased, so that the size of the semiconductor element capable of being mounted is limited. It is necessary to be able to mount a semiconductor element of about 1 cm square so as to secure sufficient current capacity. However, if the front side plate thickness exceeds 1.5 mm, it becomes difficult to secure the reliability of the solder layer that bonds a semiconductor element whose size is 1 cm square. Although it is possible to realize a configuration where the front side plate thickness/back side plate thickness is 1.5 mm/1.2 mm, preferably, the front side plate thickness/back side plate thickness is controled to not more than 1.2 mm/1.0 mm in light of the consistency with the size of the aforementioned mounted semiconductor element. At the same time, it is necessary that the front side plate thickness/back side plate thickness be not less than 0.5 mm/0.4 mm in order to realize thermal conductivity characteristics using a silicon nitride circuit board, which are equivalent to those of an aluminum nitride circuit board. Due to the aforementioned reasons, preferably, the combination of the front side plate thickness and the back side plate thickness (front side plate thickness/back side plate thickness) is within a range of 0.5 mm/0.4 mm to 1.2 mm/1 mm. In other words, preferably, the sum of the thicknesses of the metal plates bonded to both sides is in a range of 0.9 mm to 2.2 mm.

The insulated plate or the ceramic plate including a silicon nitride insulated layer becomes effective in the thermal conductivity characteristics as the thickness thereof is decreased. By contrast, however, the insulation characteristics are liable to be reduced and the plate tends to be warped at the same time. The thickness of the insulated layer and the thickness of the metal plates on both sides in the circuit board are set in consideration of target thermal conductivity characteristics, insulation characteristics, and the amount of warpage (a thickness of about 0.1 mm to 2 mm is preferred).

As mentioned above, if the weight of the circuit board is increased, the solder layer under the circuit board becomes thin because of the weight thereof. If the thickness of the solder layer is not more than 30 μm, defects, such as voids that resulted from a residual gas in the solder layer, are trapped in the solder layer and the thermal radiation characteristics are impeded. The defects cannot be removed by merely decompressing. If the thickness the solder layer under the board is too thick, the thermal radiation is impeded, so that the thickness of the solder layer is set to about 100 μm on the basis of the balance of a stress relaxation effect assumed by the solder layer. Generally, conventional examples include spacers disposed in the solder layer or projections disposed on a member for securing the thickness of the solder layer. However, the inventors found that by disposing elements in the solder layer under the circuit board, the elements facilitating the movement of a gas, the residual of defects, such as voids generated in the solder layer in a heating step, can be substantially reduced by decompression. It has been learned from an examination by the inventors that the effects of the defect removal are related to the minimum thickness of the solder layer after a component is mounted, and function effectively if the thickness of the solder layer is not less than 50 μm. An area where the thickness of the solder layer is about 40 μm has cases where the defects cannot be removed, and it is difficult to realize a stable defect removal.

As shown in FIG. 2A, if the thickness of the solder layer is less than 50 μm as mentioned above, when pressure is changed from a normal pressure (left figure) to a reduced pressure (middle figure), the volume of a defect (void) 11 in the solder layer 4a is expanded (11a) in accordance with the degree of decompression thereof. However, the adhesion strength between the defect 11 and the upper and lower surfaces has a great influence, so that the movement of the defect 11 in the in-plane direction of the bond area between the copper plate 3b and the base plate 1 is liable to be impeded. Even after the decompression is cancelled (right figure), the defect 11 tends to remain in the solder layer 4a (11b).

By contrast, in the case of FIG. 2B where the thickness of the solder layer is not less than 50 μm, the volume of the defect is expanded and the defect is capable of readily moving to the outside during decompression, so that the probability that the defect is removed from the solder layer is increased (see the middle figure and the right figure in FIG. 2B)). Preferably, the thickness of the aforementioned bond area in the normal direction regarding elements that specify the thickness of the solder layer is in a range of 50 μm to 200 μm in view of conditions of the aforementioned solder thickness.

Concerning the degree of decompression during decompression, a degree of decompression of at least not more than 100 Pa is necessary through an examination of the inventors. Although the degree of decompression is thought to have no lower limit, it is difficult to realize a degree of decompression of not more than 0.1 Pa when an object is a semiconductor device comprising various types of materials. The degree of decompression that realizes an effective defect removal more realistically is 1 Pa to 100 Pa.

Figure 3A:
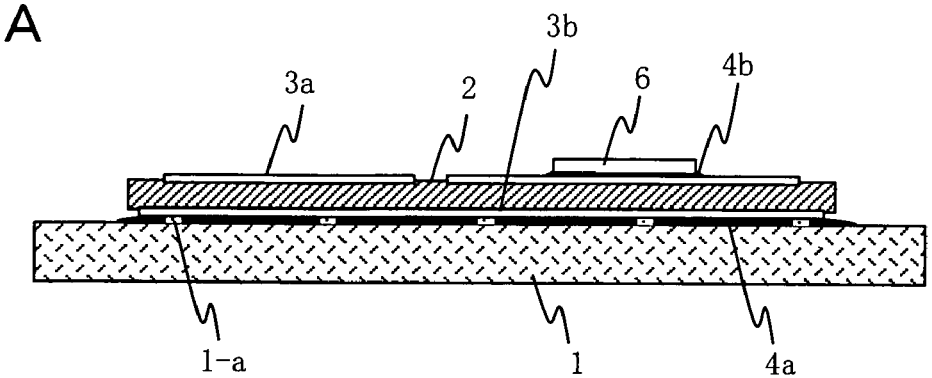
FIG. 3A to 3C show cross-sectional view of elements that are effective in defect removal in a solder layer according to the present embodiment.
Figure 3B:
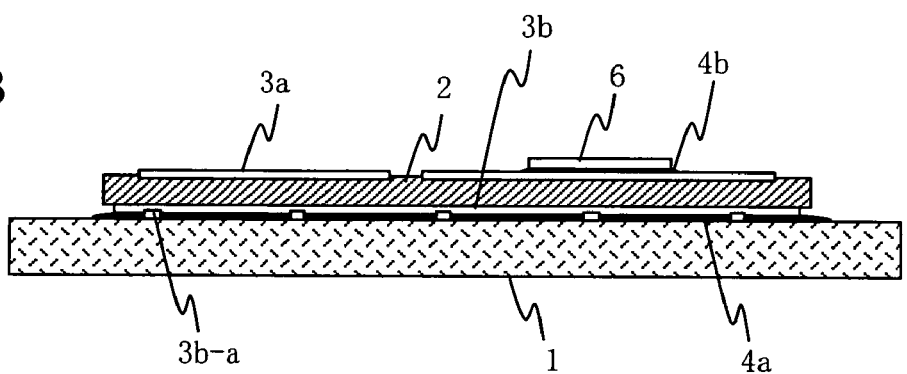
Figure 3C:
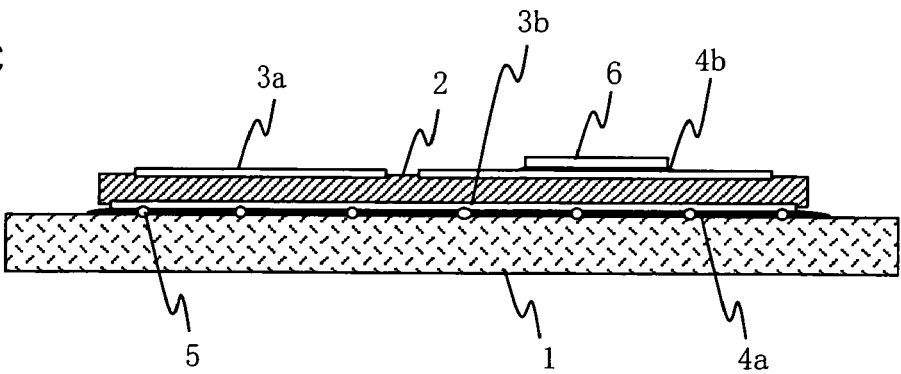

As elements, it is effective to apply various types of elements shown in FIG. 3A to 3C. FIG. 3A shows a cross-sectional view of a configuration where protruding elements 1-a whose height is 50 μm to 200 μn regarding the normal direction of the bond area are disposed on the solder bond area side of the base plate 1. As shown in FIG. 3A, the thickness of the solder layer 4a can be specified to be the aforementioned value by causing the top faces of the protruding elements 1-a to abut on the bottom face of the silicon nitride plate 2. FIG. 3B shows a cross-sectional view of a configuration where protruding elements 3b-a protruding downward whose height is 50 μm to 200 μn regarding the normal direction of the bond area are disposed on the back surface metal plate 3b on the back side of the insulated circuit board. In this case, the thickness of the solder layer 4a can also be specified to be the aforementioned value by causing the bottom faces of the protruding elements 3b-a to abut on the top face of the base plate 1. In FIG. 3C, substantially spherical elements 5 whose maximum particle size is 50 μm to 200 μm are disposed in the solder layer 4a under the circuit board 1a (FIG. 1, same as above). The substantially spherical elements 5 shown in FIG. 3C are capable of stably existing without melting even if solder is in a melted state. Metal material particles selected from the group consisting of nickel, zinc, gold, silver, titanium, copper, and platinum are suitable in consideration of wettability for solder. However, materials are not limited only to these substances as long as they are suitable for the main object of the present invention. If the added volume of the substantially spherical elements is too much, they are liable to generate aggregation, so that it is suitable to adjust the volume in a range of 0.005 vol % to 5 vol % relative to the volume of solder. If the volume exceeds 5 vol %, an overlap of the substantially spherical elements 5 tends to be generated and the thickness of the solder layer tends to be thick. By contrast, if the volume is not more than 0.005 vol %, it becomes difficult to uniformly distribute the elements 5 and in some cases, the distribution of the elements 5 is biased, so that desired void passages may not be formed. By maintaining the added volume within the aforementioned range, passages (paths) toward the outside tend to be formed during void formation.

By maintaining a suitable space for the bond area using the aforementioned protruding elements and the spherical elements, and by forming paths in the solder layer by which voids can be escaped to the outside, voids generated in a manufacturing step, especially in a reflow soldering step, are caused to escape to the outside, thereby preventing the residual of defects due to voids.

The aforementioned protruding elements and the spherical elements are an example, so that the protruding elements may form a groove extending from one end side of the solder layer to the other end side, for example.

As mentioned above, in the resin encapsulated semiconductor device according to the present embodiment, it is learned that a circuit board can be realized by using silicon nitride for the insulated layer, the circuit board having superior strength even when a metal plate whose thickness is about 1 mm is bonded. Further, in a step for mounting the circuit board on the base plate 1, it is learned that the generation of void-like defects in the solder layer can be reduced by soldering under reduced pressure using solder to which nickel particles are added, thereby controlling the generation of the defects. This is advantageous in that the generation of the defects can be controlled and that almost the same thermal resistance as that of an aluminum nitride circuit board (in the case of comparative example 5 mentioned in the following) can be realized even when silicon nitride is used, since it becomes possible to thicken the metal plate bonded to the circuit board 1a.

Figure 4A:
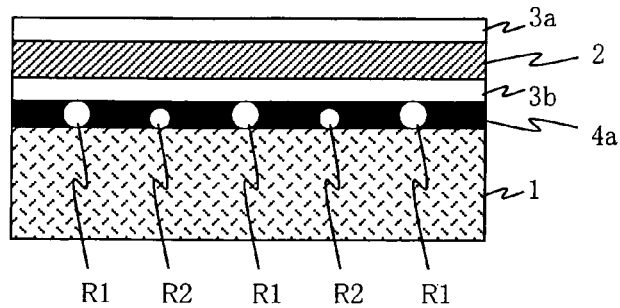
FIG. 4A to 4D show cross-sectional views of modified examples of elements that are effective in defect removal in a solder layer according to the embodiments of the present invention.
Figure 4B:
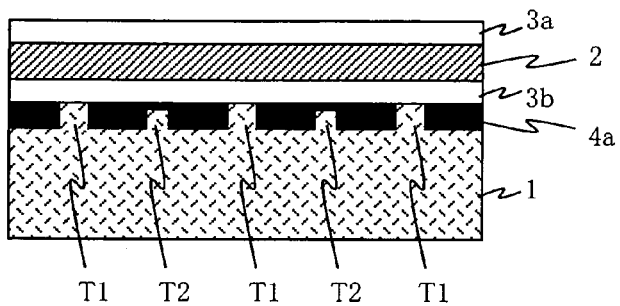

In the following, a modified example of FIG. 3 is described. FIG. 4A to 4B show diagrams of various forms of elements. The diagrams show the combinations of elements having different average particle sizes or different average heights or elements having different forms. Basically, the elements have a first element group and a second element group. The first element group is used to specify a space. The second element group is smaller than the first element group and is not used to specify the space between the metal plate 3b under the insulated circuit board 1a and the base plate 1. However, the second element group has a function for delimiting paths so as to remove voids generated when the solder layer is reflowed. The particle sizes or heights do not require a regular formation as shown in the figures, so that they may have Gaussian distribution, for example. Also, a third element group whose particle size or height is smaller than that of the second element group may be disposed.

A configuration shown in FIG. 4A comprises first spherical elements R1 having a particle size for specifying a space between the copper plate 3b under the insulated circuit board 1a and the base plate 1, and second spherical elements R2 having a smaller diameter relative to the first spherical elements R1. The second spherical elements R2 form paths among them or between the second spherical elements R2 and the first spherical elements R1 so as to remove voids generated during reflowing.

A configuration shown in FIG. 4B comprises first protrusions T1 formed on the base plate 1 or the copper plate 3b (in the drawing, the first protrusions T1 are formed on the base plate 1) between the copper plate 3b under the insulated circuit board 1a and the base plate 1, the first protrusions T1 having a height for specifying a space between them, and second protrusions T2 whose height is smaller than that of the first protrusions T1. In this case, the second protrusions T2 form paths among them or between the second protrusions T2 and the first protrusions T1 so as to remove voids generated during reflowing. These protruding elements can be formed via press working, cutting work, or the like. However, these methods are not limited.

Figure 4C:
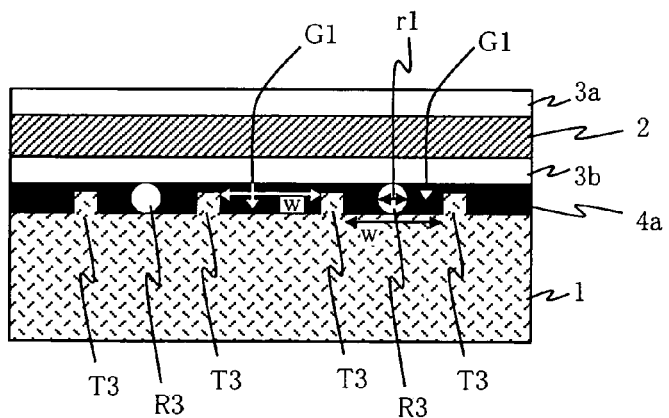

A configuration shown in FIG. 4C comprises third spherical elements R3 having a particle size for specifying a space between the copper plate 3b under the insulated circuit board 1a and the base plate 1, and third protrusions T3 whose height is smaller than the particle size. In this case, the third protrusions T3 form paths among them or between the third protrusions T3 and the third spherical elements R3 so as to remove voids generated during reflowing. In this case, the width of grooves G1 must be larger than the particle size of the third spherical elements R3 so that the third spherical elements R3 will not be stuck in the grooves G1 formed among the third protrusions T3 adjacent to one another.

Figure 4D:
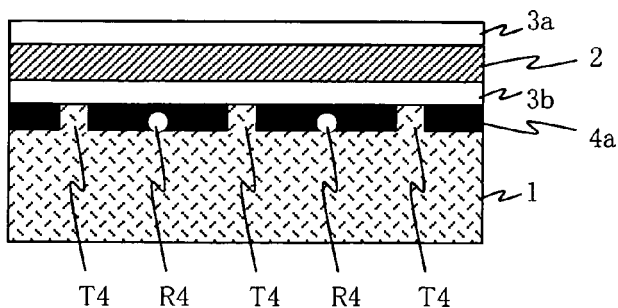
Figure 5:
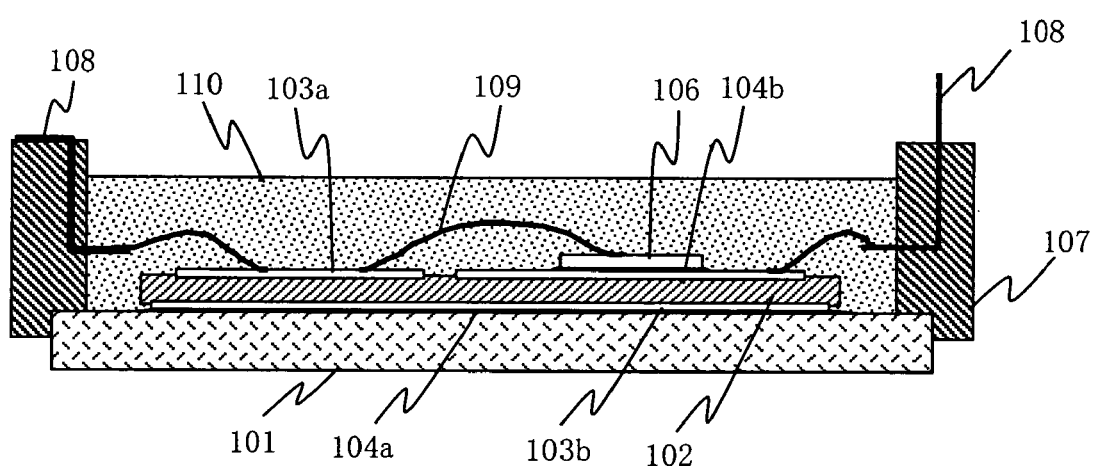
FIG. 5 schematically shows a cross-sectional configuration of a conventional resin encapsulated semiconductor device.

A configuration shown in FIG. 4D comprises fourth protrusions T4 having a height for specifying a space between the copper plate 3b under the insulated circuit board 1a and the base plate 1, and fourth spherical elements R4 whose particle size is smaller than the height. In this case, the fourth protrusions T4 form paths among them or between the fourth protrusions T4 and the fourth spherical elements R4 so as to remove voids generated during reflowing. In this case, the width of grooves must be larger than the particle size so that the particle size of the fourth spherical elements R4 will not be stuck in the grooves formed among the fourth protrusions T4 adjacent to one another. Although it is not shown in the drawings, a concave groove may be formed on the base plate 1 or the copper plate 3b.

As mentioned above, if silicon nitride is used as the insulated layer of the circuit board, it is possible to realize thermal radiation characteristics exceeding those of an aluminum nitride circuit board by thinning the insulated layer and by thickening the metal plates bonded to both sides. In consideration of this fact, the thickness of the front side metal plate is preferably not less than 0.5 mm.

A resin encapsulated semiconductor device according to a second embodiment of the present invention is described with reference to the drawing (see FIG. 1). In the present embodiment, the resin encapsulated semiconductor device is assembled under the same conditions as in the first embodiment except that the configuration of the used circuit board 1a is different. The circuit board 1a used in this case comprises the silicon nitride 2 whose thickness is 0.3 mm with copper plates of 0.5 mm and 0.4 mm boded to both sides thereof via active metal. When the solder bonding layer 4a under the circuit board 1a of the resin encapsulated semiconductor device according to the present embodiment is observed using an ultrasonic reflectscope, almost no defects, such as voids, are found in the solder layer 4a (the area ratio of defect portions relative to the solder bonding area is not more than 0.5%). When a current is applied to a mounted element to generate heat and the thermal resistance of the semiconductor device is measured, the thermal resistance is 0.2° C./W.

Also, 500 times of thermal cycle processes at −60° C. to 150° C. are provided to the assembled resin encapsulated semiconductor device in the same manner. After the thermal cycle processes, state observation and characteristic measurement are conducted. As a result, it is learned that abnormalities, such as destruction of members, exfoliation of bonded portions, and the like are not observed, and thermal resistance shows almost no change in the resin encapsulated semiconductor device according to the present embodiment. And it is learned that thermal resistance characteristics equivalent to those of an aluminum nitride circuit board (comparative example 5 described later) can be realized by having the thickness of silicon nitride of the circuit board 1a thinner than in the case of the first embodiment, even when the thicknesses of metal plates bonded to both sides are thinner than in the case of the first embodiment.

A resin encapsulated semiconductor device according to a third embodiment of the present invention is described with reference to the drawing (see FIG. 1). In the present embodiment, the resin encapsulated semiconductor device is assembled under the same conditions as in the first embodiment except that the configuration of the used circuit board 1a is different. The circuit board 1a used in this case comprises the silicon nitride 2 whose thickness is 0.3 mm with copper plates of 0.7 mm and 0.5 mm boded to both sides thereof via active metal. When the solder bonding layer 4a under the circuit board 1a of the resin encapsulated semiconductor device according to the present embodiment is observed using an ultrasonic reflectscope, almost no defects, such as voids, are found in the solder layer 4a (the area ratio of defect portions relative to the solder bonding area is not more than 0.5%). When a current is applied to a mounted element to generate heat and the thermal resistance of the semiconductor device is measured, the thermal resistance is 0.13° C./W.

Further, 500 times of thermal cycle processes at −60° C. to 150° C. are provided to the assembled resin encapsulated semiconductor device in the same manner. After the thermal cycle processes, state observation and characteristic measurement are conducted. As a result, it is learned that abnormalities, such as destruction of members, exfoliation of bonded portions, and the like, are not observed, and thermal resistance shows almost no change in the resin encapsulated semiconductor device according to the present embodiment. And it is learned that a circuit board superior to the aluminum nitride circuit board (comparative example 5 described later) in both strength and thermal resistance characteristics can be realized by having the thickness of silicon nitride of the circuit board 1a thinner than in the case of the first embodiment.

In the following, the device according to the embodiments of the present invention and a device according to comparative examples are described.

In a first comparative example, a resin encapsulated semiconductor device is assembled under the same conditions as in the first embodiment except that solder under the circuit board 1a (see FIG. 1, same as above) is different. The solder 4a under the circuit board 1a used in this case is a tin-silver-copper cream solder to which no nickel particles 5 are added (see FIG. 1).

When the solder bonding layer 4a under the circuit board 1a of the resin encapsulated semiconductor device according to the present first comparative example is observed using an ultrasonic reflectscope, a lot of void-like defects are generated in the solder layer 4a. Especially, the void-like defects show a tendency to be distributed intensively in the central portion of the circuit board 1a (the area ratio of defect portions relative to the solder bonding area is 15% to 20%). When a current is applied to a mounted element to generate heat and the thermal resistance of the semiconductor device is measured, the thermal resistance is 0.25° C./W to 0.3° C./W. In the first comparative example, nickel particles are not added to the solder layer 4a under the circuit board 1a, so that a lot of the void-like defects are generated even when soldering is conducted under reduced pressure. It is learned that an area where the defects are generated has an adverse influence on the thermal emission of the semiconductor device, since the area has a tendency to be overlapped with an area directly under the mounted element.

In the following, a second comparative example is described. A resin encapsulated semiconductor device is assembled under the same conditions as in the first comparative example except that reflow soldering conditions are changed. The reflow soldering conditions used in this case do not include a decompression step in the first embodiment, and reflow is performed using a heating profile including a nitrogen atmosphere and a peak temperature of 280° C.

When the solder bonding layer 4a under the circuit board 1a of the resin encapsulated semiconductor device according to the third comparative example is observed using an ultrasonic reflectscope, a lot of void-like defects are generated in the solder layer 4a. Especially, the void-like defects show a tendency to be distributed intensively in the central portion of the circuit board 1 (the area ratio of defect portions relative to the solder bonding area is 15% to 20%). When a current is applied to a mounted element to generate heat and the thermal resistance of the semiconductor device is measured, the thermal resistance is 0.25° C./W to 0.3° C./W.

As in the second comparative example, when the nickel particles 5 are not added to the solder 4a under the circuit board 1a and soldering is performed without decompression, a lot of void-like defects are generated. The situation of defect generation is the same as in the first comparative example. An area where the defects are generated has a great influence on the thermal emission of the semiconductor device, since the area has a tendency to be overlapped with an area directly under the mounted element.

In the following, a third comparative example is described. In the third comparative example, a resin encapsulated semiconductor device is assembled under the same conditions as in the second comparative example except that the solder layer 4a under the circuit board 1a is changed to the solder 4a to which the nickel particles 5 (FIG. 1) used in the first and the second embodiments are added.

When the solder bonding layer 4a under the circuit board 1a of the resin encapsulated semiconductor device according to the present second comparative example is observed using an ultrasonic reflectscope, a lot of void-like defects are generated in the solder layer 4a. Especially, the void-like defects show a tendency to be distributed intensively in the central portion of the circuit board 1a (the area ratio of defect portions relative to the solder bonding area is 15% to 20%). When a current is applied to a mounted element to generate heat and the thermal resistance of the semiconductor device is measured, the thermal resistance is 0.25° C./W to 0.3° C./W.

In the present comparative example, although the nickel particles 5 are added to the solder layer 4a under the circuit board 1a, a lot of void-like defects are generated as a result of soldering without decompression. The situation of defect generation is the same as in the first and the second comparative examples. An area where the defects are generated has an influence on the thermal emission of the semiconductor device, since the area has a tendency to be overlapped with an area directly under the mounted element.

In the following, a fourth comparative example is described. By changing silicon nitride in the insulated layer to aluminum nitride, a circuit board 1a having the same configuration as the circuit board 1a used in the first and the second embodiments is prepared. In this configuration, after metal plates are bonded to both sides of the aluminum nitride via active metal, cracking is generated in the aluminum nitride at the time when it is cooled to room temperature. It is learned that if aluminum nitride is used as in this case, a circuit board having the same configuration as that of the embodiments cannot be realized.

In the following, a fifth comparative example is described. A resin encapsulated semiconductor device is assembled under the same conditions as in the first embodiment except that the configuration of a used circuit board is different. The circuit board used in this case comprises aluminum nitride whose thickness is 0.635 mm with copper plates of 0.3 mm and 0.2 mm bonded to both sides thereof via active metal. When the solder bonding layer 4a under the circuit board 1a in the resin encapsulated semiconductor device is observed using an ultrasonic reflectscope, almost no defects, such as void, are found in the solder layer 4a (the area ratio of defect portions relative to the solder bonding area is not more than 0.5%). When a current is applied to a mounted element to generate heat and the thermal resistance of the semiconductor device is measured, the thermal resistance is 0.2° C./W.

For the resin encapsulated semiconductor device assembled in the fifth comparative example, 500 times of thermal cycle processes at −60° C. to 150° C. are provided. After the thermal cycle processes, state observation and characteristic measurement are conducted. As a result, exfoliation-like defects are generated from the periphery on the aluminum nitride side of the bonded portion of the circuit pattern. An area where the defects are generated is peripheral, so that the thermal resistance shows almost no change. However, it is learned that strength is problematic if aluminum nitride is used.

In the following, a sixth comparative example is described. A resin encapsulated semiconductor device is assembled under the same conditions as in the first embodiment except that the configuration of a circuit board used in the sixth comparative example is different. The circuit board 1a used in this case comprises silicon nitride whose thickness is 0.635 mm with copper plates of 0.3 mm and 0.2 mm bonded to both sides thereof via active metal. In other words, the thicknesses of the copper plates are merely different from the first embodiment, and the material of the circuit board is merely different from the fifth comparative example.

When the solder bonding layer 4a under the circuit board 1a of the resin encapsulated semiconductor device is observed using an ultrasonic reflectscope, almost no defects, such as void, are found in the solder layer 4a (the area ratio of defect portions relative to the solder bonding area is not more than 0.5%). When a current is applied to a mounted element to generate heat and the thermal resistance of the semiconductor device is measured, the thermal resistance is 0.34° C./W.

For the resin encapsulated semiconductor device assembled in this case, 500 times of thermal cycle processes at −60° C. to 150° C. are provided. After the thermal cycle processes, state observation and characteristic measurement are conducted. Abnormalities, such as destruction of members, exfoliation of bonded portions, and the like, are not observed, and thermal resistance shows almost no change. Although the silicon nitride circuit board is superior in strength, it has disadvantages in thermal resistance characteristics when the same configuration as in the aluminum nitride circuit board (comparative example 5) is employed. Thus, the thicknesses of the copper plates are preferably thick as in the first to the third embodiments.

As stated above, in the resin encapsulated semiconductor device according to each embodiment of the present invention, by using the circuit board in which thick metal plates whose sum of the thicknesses is not less than 0.9 mm are bonded to both sides of silicon nitride that is superior in strength characteristics and by soldering the circuit board to the solder layer mounted on the base plate with spherical elements disposed on the solder layer under reduced pressure, a solder bonding layer with almost no void-like defects can be realized, thereby realizing a semiconductor device superior in thermal radiation characteristics and strength reliability as compared with a semiconductor device in which a conventional circuit board is used. Further, by including elements with different diameters in the solder layer, although a function for specifying a space is not provided, paths for voids can be actively formed. Although grooves may be formed instead of protrusions, preferably, an extending direction in this case is formed in the shortest direction to a board edge, namely, as a near-radial pattern from the central area of the board.

Although the present invention is described in accordance with the embodiments, the present invention is not limited to these embodiments. It is obvious to a person skilled in the art that various modifications, improvement, or combination is possible.

Although the present invention can be applied to power modules for amounting on automobiles, it can also be used for various types of machinery in which thermal cycles are repeated.

What is claimed is:

1. A resin encapsulated semiconductor device comprising a thermal conductive base plate, an insulated circuit board bonded to the base plate via a bonding material, an electronic component mounted on the insulated circuit board, and an outer case attached to the base plate, the base plate and the outer case together forming a portion for internally accommodating the electronic component, wherein
   the insulated circuit board comprises an insulated plate and a metal plate bonded to either side of the insulated plate, and
   the sum of the thicknesses of the metal plates is in a range of 0.9 mm to 2.2 mm, and the minimum thickness of the bonding material is maintained to be not less than 50 µm.

2. The resin encapsulated semiconductor device according to claim 1, wherein the insulated plate comprises silicon nitride and has a thickness of 0.1 mm to 2 mm.

3. A resin encapsulated semiconductor device comprising a thermal conductive base plate, an insulated circuit board bonded to the base plate via a bonding material, an electronic component mounted on the insulated circuit board, and an outer case attached to the base plate, the base plate and the outer case together forming a portion for internally accommodating the electronic component, wherein
   the insulated circuit board comprises an insulated plate and a metal plate bonded to either side of the insulated plate, and
   the sum of the thicknesses of the metal plates is in a range of 0.9 mm to 2.2 mm, and a wall portion is disposed in the bonding material by which a conducting path for a gas generated in the bonding material is formed.

4. The resin encapsulated semiconductor device according to claim 3, wherein the insulated plate comprises silicon nitride and has a thickness of 0.1 mm to 2 mm.

5. A resin encapsulated semiconductor device comprising a thermal conductive base plate, an insulated circuit board bonded to the base plate via a bonding material, an electronic component mounted on the insulated circuit board, and an outer case attached to the base plate, the base plate and the outer case together forming a portion for internally accommodating the electronic component, wherein
   the insulated circuit board comprises a ceramic plate, to both sides of which metal plate are bonded, and the sum of the thicknesses of the metal plates bonded to both sides, is in a range of 0.9 mm to 2.2 mm; and a substantially spherical element for forming a wall portion is added to the bonding material.

6. The resin encapsulated semiconductor device according to claim 5, wherein the ceramic plate comprises silicon nitride and has a thickness of 0.1 mm to 2 mm.

7. The resin encapsulated semiconductor device according to claim 5, wherein the elements comprise a metal particle having a melting point that is higher than that of the bonding material, or a protrusion formed on at least one of the base plate or the metal plate.

8. The resin encapsulated semiconductor device according to claim 7, wherein an element including the metal particle or the protrusion comprises a first element group and a second element group whose diameters or heights are different.

9. The resin encapsulated semiconductor device according to claim 7 or 8, wherein the maximum diameter of the metal particle or the maximum height of the protrusion is in a range of 50 μm to 200 μm, and the amount of the element added is in the range of 0.005 vol % to 5 vol % relative to the volume of a conductive component in the bonding material.

10. The resin encapsulated semiconductor device according to claim 5, wherein the elements comprise a metal material selected from the group consisting of nickel, zinc, gold, silver, titanium, copper, and platinum.

11. The resin encapsulated semiconductor device according to claim 1, wherein the electronic component comprises a semiconductor inverter circuit to be mounted on an automobile.

12. The resin encapsulated semiconductor device according to claim 3, wherein the electronic component comprises a semiconductor inverter circuit to be mounted on an automobile.

13. The resin encapsulated semiconductor device according to claim 5, wherein the electronic component comprises a semiconductor inverter circuit to be mounted on an automobile.

* * * * *